(12) United States Patent
Fukuda et al.

(10) Patent No.: US 6,187,691 B1
(45) Date of Patent: Feb. 13, 2001

(54) METHOD OF FORMING FILM ON SEMICONDUCTOR SUBSTRATE IN FILM-FORMING APPARATUS

(75) Inventors: Hideaki Fukuda; Hiroki Arai; Yu Yoshizaki, all of Tama (JP)

(73) Assignee: ASM Japan K.K., Tokyo (JP)

( * ) Notice: Under 35 U.S.C. 154(b), the term of this patent shall be extended for 0 days.

(21) Appl. No.: 09/570,195

(22) Filed: May 15, 2000

(30) Foreign Application Priority Data

May 14, 1999 (JP) .................................................. 11-134072

(51) Int. Cl.[7] ................................. H01L 21/31; C23C 8/00
(52) U.S. Cl. .......................... 438/758; 438/778; 438/905; 427/585; 427/588
(58) Field of Search ..................................... 438/758, 778, 438/905; 427/585, 588; 118/723 E

(56) References Cited

U.S. PATENT DOCUMENTS

| 5,567,661 | * | 10/1996 | Nishio et al. | 437/228 |
| 5,865,896 | * | 2/1999 | Nowak et al. | 118/723 |
| 5,930,657 | * | 7/1999 | Kim et al. | 438/482 |

* cited by examiner

Primary Examiner—Charles Bowers
Assistant Examiner—Alexander G. Ghyka
(74) Attorney, Agent, or Firm—Knobee, Martens, Olson & Bear, LLP

(57) ABSTRACT

A thin film is formed on a substrate in a film-forming apparatus which has upper and lower electrodes between which radio-frequency power is applied in a processing chamber, and a heater is used to heat the lower electrode on which the substrate is loaded. In one lot, at least one substrate is processed. The electrode is heated at the end of a stand-by period between lots and before starting the film-forming process.

11 Claims, 4 Drawing Sheets

(1) Convention film-forming processing method (2) Film-forming processing method according to the present invention ⊠D⊠ Wafer film-forming process C Reaction chamber cleaning process ⊠DD⊠ Dummy film-forming process DC Dummy cleaning process PR Pressure rising in reaction chamber Change in film thickness with the number of plasma nitride films processed according to the conventional technology Change in refractive index with the number of plasma nitride films processed according to the conventional technology Change in film stress with the number of plasma nitride films processed according to the conventional technology Change in film thickness with the number of plasma nitride films processed according to the conventional technology Change in refractive index with the number of plasma nitride films processed according to the conventional technology Change in film stress with the number of plasma nitride films processed according to the conventional technology

METHOD OF FORMING FILM ON SEMICONDUCTOR SUBSTRATE IN FILM-FORMING APPARATUS

BACKGROUND OF THE INVENTION

1. Field of the Invention

The present invention relates to a film-forming method of forming a thin film on a substrate-to-be-processed. It particularly relates to a film-forming method of homogenizing a thin film formed on each substrate-to-be-processed when forming a thin film continuously on multiple substrates-to-be-processed.

2. Description of the Related Art

A plasma CVD (Chemical Vapor Deposition) apparatus forms a thin film on the surface of a substrate-to-be-processed by applying radio-frequency power between an upper electrode, which also functions as a showerhead which supplies a reaction gas to a processing chamber, and a lower electrode which also functions as a loading platform for loading substrates-to-be-processed such as semiconductor wafers. Sediment is left on inner walls, etc. of the processing chamber during this film-forming process. If this comes off, it causes particle contamination in the next film-forming process. For this reason, the processing chamber is cleaned periodically.

For such apparatuses, when a lot (one lot can be, for example, one cassette (25 wafers)) is processed continuously, the film-forming process and the cleaning process are repeated alternately. After maintenance of the apparatus is performed, until the result of a film quality inspection of wafer processing is obtained, a stand-by situation where no film forming is performed occurs between the lot processes.

The number of stand-by times shows a tendency to increase particularly as the number of semiconductor manufacturing plants which manufacture semiconductor devices with more different types in smaller lots increases, as a diameter of wafer becomes larger in recent years, and as semiconductor devices are more diversified.

SUMMARY OF THE INVENTION

If this stand-by situation continues for a certain time, a surface temperature of electrode parts on which a semiconductor wafer is loaded drops and a temperature of the wafer loaded on it also drops. Consequently, even if other processing conditions are set identically, in the continuous lot process, it causes a negative influence such as a decline in density and change in film composition on a thin film formed on the first and the second semiconductor wafers after the stand-by period. For this reason, film characteristics such as workability and hygroscopicity resistance, which are designed when a semiconductor device is manufactured, are spoiled. This eventually results in malfunction of the semiconductor device, i.e., a cause of defective products and a decline in yield.

The negative influence on film-forming occurring immediately after stand-by has become serious due to increased heat capacity of a wafer itself as a diameter of the wafer which is a substrate-to-be-processed recently increases.

The present invention was achieved to solve this task, and it aims to provide a film-forming method which prevents a negative influence on the characteristics of film forming caused by a drop in a temperature of an electrode which is a loading platform for loading a substrate-to-be-processed.

Another object of the present invention is to provide the above-mentioned film-forming method which forms a homogeneous film during continuous lot processing.

The film-forming method according to the present invention which achieves the above-mentioned objects has upper and lower electrodes in a processing chamber, between which radio-frequency power is applied, and which forms a thin film on a substrate-to-be-processed in a film-forming apparatus which heats an electrode on which the substrate-to-be-processed is loaded, and which is characterized in that at the end of a stand-by period and before the film-forming process is initiated by loading a substrate-to-be-processed on the electrode, a process of raising a temperature of the lower electrode is included. This film-forming process can be a continuous film-forming process where after stand-by, a substrate-to-be-processed is conveyed and is loaded on the electrode and the film-forming process is performed continuously on multiple substrates-to-be-processed. In an embodiment, the temperature of the lower electrode reaches a temperature for continuous film formation ± approximately 5° C. In the above, when it is not technically practical to measure the temperature of the electrode to confirm that the temperature reaches a desired temperature, by monitoring the thickness of films formed on substrates, it is possible to determine whether the temperature control is appropriate based on uniformity of thickness of the formed films. Incidentally, the temperature of the electrode is considered to be 5–10° C. higher than the temperature of a substrate placed thereon.

A heater heats an electrode on which a substrate-to-be-processed is loaded and raises a temperature to a desired level. If the electrode and the heater are not incorporated (when they are divided by being fastened with screws, etc.), a temperature of the electrode cannot be raised quickly to a desired level (a temperature for film formation ± approximately 5° C.). At this time, by supplying gas to a processing chamber, the heat of the heater can be effectively transmitted to the electrode on which a substrate-to-be-processed is loaded and the electrode can be heated quickly. For example, the pressure of the chamber is maintained conventionally at several mTorr during a stand-by period until a first substrate is loaded in the chamber, and thus even if the temperature of the heater is set at 420° C., the temperature of the lower electrode (susceptor) has decreased to 320–350° C. at the end of the stand-by period. By raising the pressure of the chamber, heat transfer from the heater to the lower electrode can be improved significantly. In the above, the temperature of the lower electrode can be approximately 50° C. higher than the conventional embodiment.

In the above, for the pressure of the processing chamber with gas supplied, pressure no less than 1 Torr is preferable (in an embodiment, 4±1 Torr). Gas to be supplied to the processing chamber can be a cleaning gas which is activated by a remote plasma discharge apparatus.

Additionally, a process of raising the temperature of the electrode can be a process of supplying gas including a reaction gas into the processing chamber and generating plasma. Further, the process of raising the electrode temperature can include a process of dummy-cleaning a dummy film on the electrode, which is formed by this plasma. In this case, for example, when a silicon nitride film is formed, gas which contains more than one type of gas containing fluorine such as $NF_3$ is excited by a remote plasma apparatus and is brought in the processing chamber and a dummy film is removed by dummy cleaning. Because of heat generated at the reaction of the film and the cleaning gas, a surface temperature of the electrode rises effectively. Moreover, after the dummy-cleaning process, a process of supplying gas to the processing chamber can be included.

Furthermore, if a process of raising temperature of the electrode is performed before a substrate-to-be-processed is conveyed to the processing chamber, processing time can be shortened.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 2(2) shows a series of processes of the film-forming method according to the present invention.

DESCRIPTION OF THE PREFERRED EMBODIMENT

Figure 1:
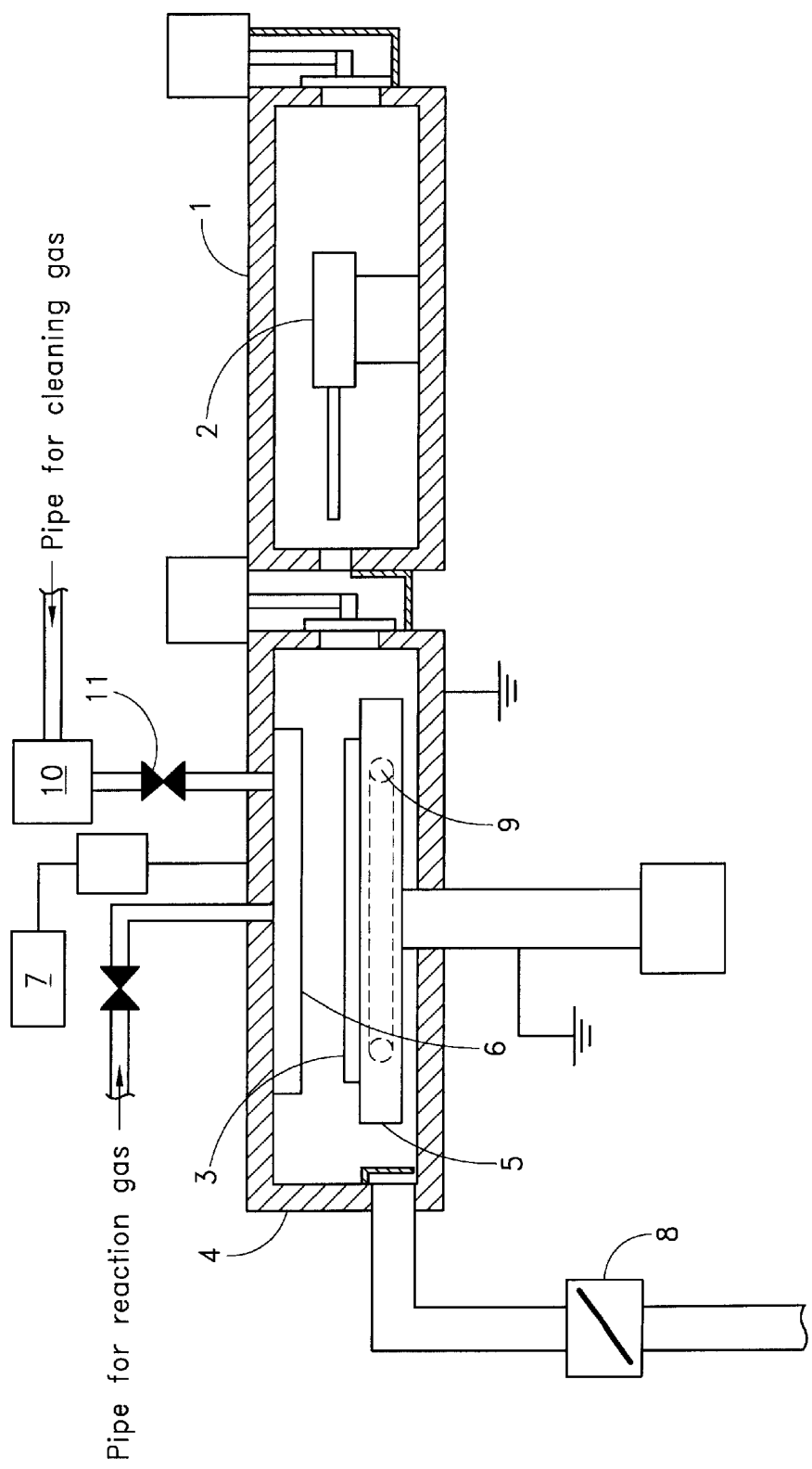
FIG. 1 roughly shows a cross section of a parallel-plate type plasma CVD apparatus by which the present invention is implemented.

FIG. 1 shows a parallel-plate type plasma CVD apparatus which is one example of an apparatus to implement the present invention. In addition to this, for example, in a reduced pressure thermal CVD apparatus with the same configuration as this type, the present invention can be implemented.

The CVD apparatus in FIG. 1 has a configuration of performing remote plasma cleaning for cleaning the processing chamber.

To perform a process of forming a film on one lot of semiconductor-processing substrates (25 semiconductor wafers) using this apparatus, the following operations are performed.

After the above-mentioned stand-by, one piece of semiconductor-processing substrate 3 which is placed within a transfer chamber 1 is loaded on a susceptor 5 within the processing chamber 4 adjacent to the conveying chamber 1 by an auto transfer robot 2. The susceptor 5 is an electrode equipped with a heater (heating element) 9 embedded therein. A reaction gas is evenly supplied on the substrate-to-be-processed from a showerhead 6 which is parallel to the susceptor 5. Radio-frequency power is applied between the susceptor 5 and the showerhead 6 by a radio-frequency oscillator 7.

For example, when a silicon nitride film is formed on a silicon substrate 3, a mixed gas of $SiH_4$ and $NH_3$ and $N_2$ is supplied as a reaction gas from the showerhead 6 to the processing chamber 4. The pressure within the processing chamber is controlled and adjusted to be within the scope of 1~8 Torr using a conductance regulating valve 8 linked to the processing chamber 4. The susceptor 5 on which a substrate-to-be-processed is loaded is heated by a heater and the substrate-to-be-processed 3 is heated to 300~400° C. (572~752° F.) by being loaded on the susceptor. Radio-frequency power of 13.56 MHz or mixed power of 13.56 MHz and 430 MHz is applied between the susceptor 5 and the showerhead 6. By plasma generated from this power, a thin film is formed on the substrate and after the thin film is formed, the substrate is conveyed out from the processing chamber 4 by the auto transfer robot 2.

To remove unwanted products (silicon nitride in this example) which adhere to the processing chamber 4 after the film is formed, $NF_3$ gas is brought in with argon to the remote plasma discharge chamber 10, radio-frequency output is applied there, and the gases are dissociated and activated. Activated cleaning gases are brought in the processing chamber 4 through a valve 11 and with these gases, cleaning of the inside of the processing chamber is performed.

The film-forming process and cleaning process are performed alternately for each lot.

EXAMPLES

Figure 2:
FIG. 2(1) shows a series of processes of a conventional film-forming method.
Figure 2:
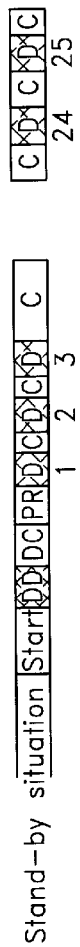

In the following, comparison between a conventional method and a method according to the present invention is explained using specific examples:

In a conventional method using an apparatus shown in FIG. 1, as mentioned in the above regarding the processing of one lot, after the stand-by period, the film-forming process and the cleaning process are performed alternately (Refer to FIG. 2(1)). For processing conditions at this time, the conditions for the film-forming process are shown in Table 1 and the conditions for the cleaning process are shown in Table 2. Further, for the film-forming time and the cleaning time, the time required for forming a silicon nitride film of 580 nm and for cleaning the inside of the processing chamber are set.

TABLE 1

| Set values at film-forming processing | |
|---|---:|
| Silane (sccm) | 220 |
| Ammonia (sccm) | 1100 |
| Nitrogen (sccm) | 600 |
| Argon (sccm) | 100 |
| Pressure in reaction chamber (Torr) | 3.75 |
| 13.56 MHz Power (W) | 480 |
| 430 KHz Power (W) | 185 |
| Heater temperature (° C./° F.) | 420/788 |
| Electrode spacing (mm) | 10 |
| Time (sec) | 50 |

TABLE 2

Set values at cleaning processing

| | |
|---|---|
| Nitrogen trifluoride (sccm) | 680 |
| Argon (sccm) | 1020 |
| Pressure in reaction chamber (Torr) | 4 |
| Heater temperature (° C./° F.) | 420/788 |
| Electrode spacing (mm) | 14 |
| Time (sec) | 15 |

Figure 3A:
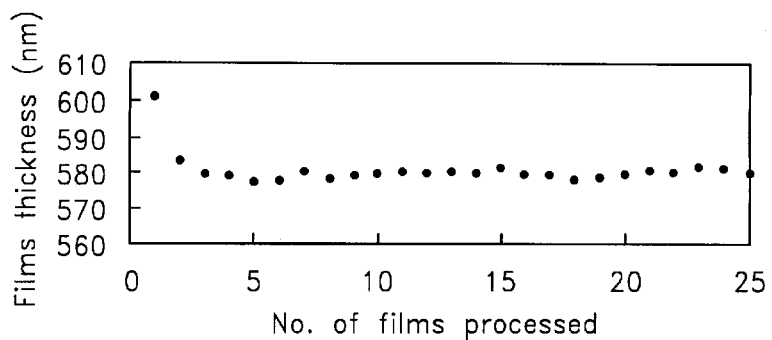
FIG. 3(a) shows change in film thickness when the lot process is performed according to the conventional method.
Figure 3B:
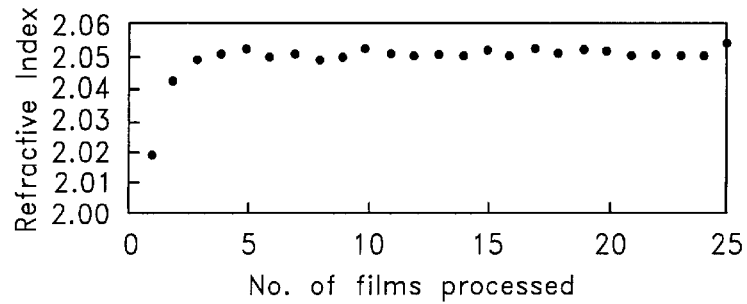
FIG. 3(b) shows change in a refractive index when the lot process is performed according to the conventional method.
Figure 3C:
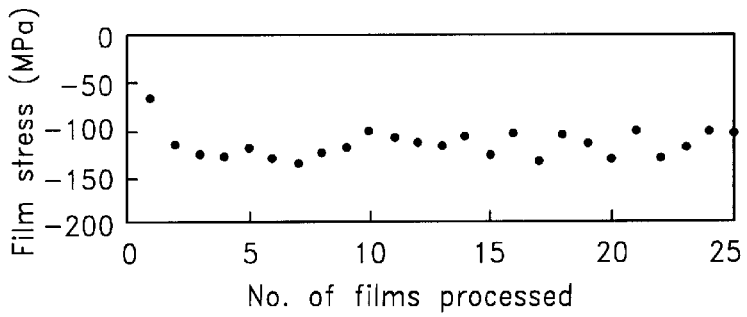
FIG. 3(c) shows change in film stress when the lot process is performed according to the conventional method.

Using the conventional method, a silicon nitride film is continuously processed for one lot (25 pieces of substrates-to-be-processed), in other words, after a certain stand-by period, when the film-forming process of the first substrate is performed, then cleaning of the inside of the processing chamber is performed and the film-forming process and the cleaning process are performed alternately after the second substrate. Change in the quality of the film formed on the substrates is shown in FIG. 3. FIG. 3 shows change in film thickness (a), change in a refractive index (b) and change in film stress (c).

As seen from FIG. 3, as compared with the film of the third substrate processed and those processed thereafter, the films of the first and second substrates processed are thicker and have a lower refractive index and smaller compression stress (particularly in the case of the first substrate). This indicates that after stand-by, a surface temperature of the susceptor on which the substrate-to-be-processed was loaded was lower than a temperature of the susceptor in the continuous film-forming process which followed.

Consequently, to perform a uniform process, it is necessary to improve the process on the first and second substrates-to-be-processed after the stand-by, particularly to improve the process on the first one. In other words, after the stand-by period, it is necessary to prevent a temperature of the substrate-to-be-processed from dropping due to a temperature drop in the susceptor.

The evenness of plasma silicon nitride films between the substrates, which were formed on 25 substrates processed by this conventional film-forming method, was ±2.03% according to the following formula:

{The evenness of film thickness between the substrates}={{(maximum film thickness value of 25 substrates)−(minimum film thickness value of 25 substrates)}/2÷(average film thickness of 25 substrates)}×100(%)

This ±2.03% value corresponds to an actual film thickness difference of approximately 23 nm. However, as mentioned previously, because forming the silicon nitride film of 580 nm is set in this example, the film thickness of the first substrate in which the maximum film thickness value is produced is approximately 600 nm.

In the above, after the silicon nitride film is formed on the first substrate as its final protection film, if fine-structure formation (etching process) is conducted by dry etching on a portion contacting wiring formed below the protection film, wherein the precision of the etching is the same as that of the silicon nitride film formation, i.e., a precision of approximately 580~590 nm, a portion of the film having a thickness of 10~20 nm will remain unremoved. This causes contact failure on the entire apparatus on the substrate.

To prevent this contact failure from occurring, it is preferable that the film uniformity between the substrates is at least a value below ±1.5%.

Each example of the film-forming method according to the present invention, which was implemented to prevent a negative influence, caused by a temperature drop in a substrate-to-be-processed due to the susceptor's temperature drop, from being exerted the film quality of the first and the second substrates, as stated above, is Table 3 below.

TABLE 3

| Process | Dummy Film Forming | Dummy Cleaning | Rising of Chamber Pressure | Rising of Heater Temperature | Film Thickness Uniformity (± %) |
|---|---|---|---|---|---|
| 1 | X | X | X | X | 2.03 |
| 2 | O | X | X | X | 1.30 |
| 3 | O | O | X | X | 1.05 |
| 4 | O | O | O | X | 0.35 |
| 5 | X | X | O | O | 1.32 |
| 6 | X | O | X | O | 0.82 |

X: Not implemented
O: Implemented 1 in Table 3 shows a conventional film-forming method which does not take any measures against a surface temperature drop in the susceptor. In this conventional example, the film thickness uniformity between substrates is ±2.03% as mentioned above.

2 in Table 3 shows the case where before a substrate-to-be-processed is conveyed in the processing chamber, a reaction gas for film forming is brought in, plasma is generated, film forming, i.e., dummy film forming, is conducted on the electrode and a surface temperature of the electrode on which the substrate-to-be-processed is loaded is raised. Film-forming conditions at this time are shown in Table 4. Further, in this case, to prevent abnormal electric discharge and electrode damage from occurring, lower radio-frequency power and a wider electrode spacing as compared with normal film-forming conditions (Table 1) are used. As a result, the film-thickness uniformity between the substrates improved to ±1.30%.

TABLE 4

Set value at dummy film forming

| | |
|---|---|
| Silane (sccm) | 220 |
| Ammonia (sccm) | 1100 |
| Nitrogen (sccm) | 600 |
| Argon (sccm) | 100 |
| Pressure in reaction chamber (Torr) | 3.75 |
| 13.56 MHz Power (W) | 300 |
| 430 KHz Power (W) | 0 |
| Heater temperature (° C./° F.) | 420/788 |
| Electrode spacing (mm) | 14 |
| Time (sec) | 30 |

3 in Table 3 shows the case where after the above-mentioned dummy film-forming was conducted, dummy cleaning to remove the dummy film was conducted. The silicon nitride film on the surface of the electrode, which was formed by dummy film-forming, and a gas excited by remote plasma were brought in the processing chamber.

The surface temperature of the electrode further rose by reaction heat generated at the time of removing the film by fluoride radicals and the film-thickness uniformity between the substrates improved up to ±1.05%. Additionally, because gas which was excited by remote plasma was used, there was no plasma damage on electrode parts and other parts.

4 in Table 3 shows the case where after the above-mentioned dummy cleaning, nitrogen gas was brought in the processing chamber at the set value shown in Table 5. In this case, if a heater and an electrode are not incorporated, thermal conduction from the heater to the electrode becomes better and a temperature of the electrode (the susceptor) on which a substrate-to-be-processed is loaded rises. The film-thickness uniformity between the substrates at this time improved to ±0.35%. Further, the gas brought in here is not limited to nitrogen gas and various gases can be used.

Figure 4A:
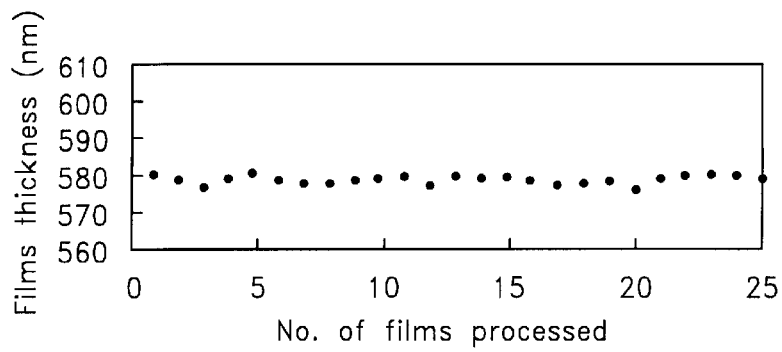
FIG. 4(a) shows change in film thickness when the lot process is performed according to the method of the present invention.
Figure 4B:
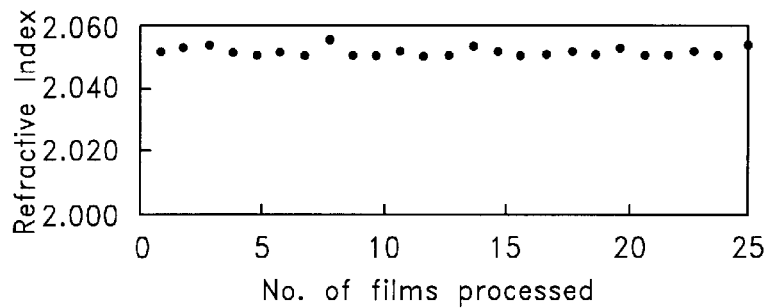
FIG. 4(b) shows change in a refractive index when the lot process is performed according to the method of the present invention.
Figure 4C:
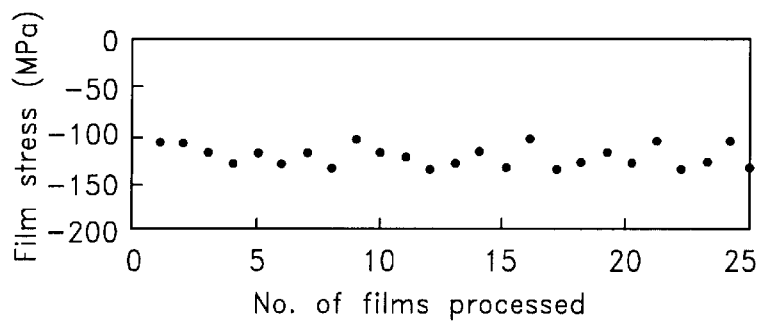
FIG. 4(c) shows change in film stress when the lot process is performed according to the method of the present invention.

Change in film thickness, change in a refractive index and change in film stress when a lot was processed after this pre-process was performed are shown in FIG. 4. As seen if comparing this figure with FIG. 3 which shows the case of the conventional method, for either of the film thickness, the refractive index and the film stress, no abnormal film quality was observed for the first and the second substrates after stand-by.

TABLE 5

Set values at pressure rising in the reaction chamber

| | |
|---|---|
| Nitrogen (sccm) | 100 |
| Pressure in reaction chamber (Torr) | 8 |
| Heater temperature (° C./° F.) | 420/788 |
| Electrode spacing (mm) | 10 |
| Time (sec) | 40 |

5 and 6 in Table 3 show the respective cases where a temperature of the heater was initially set high (at 430° C.; 10° C. higher than a temperature set for continuous film formation or regular stand-by, 420° C.) and nitrogen gas and the above-mentioned dummy cleaning gas were brought in the processing chamber. In the same way as mentioned above, the gases brought in improve thermal conduction from the heater to the electrode and a temperature of the electrode (the susceptor) on which a substrate-to-be-processed is loaded rises. The film-thickness uniformity between the substrates at this time improved to ±1.32% and ±0.82% respectively.

Table 3 shows examples of raising a susceptor temperature according to the present invention. In addition to the examples listed here, those in the trade could easily conclude that various combinations of each process would be possible. Furthermore, it could be understood that values for the processes could be set.

Additionally, it is preferable that pre-processes before film forming are performed after the start of the operation of the apparatus and before the first substrate-to-be-processed is conveyed in, because the pre-processes do not lower processing throughput.

[The Efficacy of the Present Invention]

With the present invention, a temperature drop in the surface of the electrode on which a substrate-to-be-processed is loaded can be prevented and, as a result, desired film forming can be achieved.

Because the present invention accommodates various sizes of substrates-to-be-processed which are loaded on the electrode, desired film forming can be achieved, for example, even if the heat capacity of a wafer itself increases as a diameter of a semiconductor wafer becomes larger, as in recent years. Further, the present invention can be applied if the number of stand-by periods increases where many types of semiconductor devices are manufactured in small lots or batches.

Moreover, in batch processes, when the film-forming process is performed on multiple substrates-to-be-processed, homogeneous film-forming can be achieved on each substrate by following the present invention. Particularly, because a thin film of uniform thickness can be formed on each substrate, yield in semiconductor device manufacturing can be improved and reliability can be improved.

Furthermore, by raising the surface temperature of the electrode according to the present invention before the first substrate-to-be-processed is conveyed in the processing chamber, desired film forming can be achieved without incurring a decline in productivity.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a thin film on a substrate in a film-forming apparatus comprising upper and lower electrodes in a processing chamber, between which radio-frequency power is applied, wherein a film-forming process is conducted at a designated temperature on a substrate loaded on the lower electrode which is provided with a heater, and in one lot, at least one substrate is processed, said method comprising:

at the end of a stand-by period in which no film forming is performed between lots and before initiating the film-forming process, heating the lower electrode to a temperature close to the temperature for film forming.

2. The method as claimed in claim 1, wherein in one lot, multiple substrates are continuously processed.

3. The method as claimed in claim 1, wherein the heater and the lower electrode are not integrated, and the heating step is conducted not only by using the heater but also by supplying gas into the processing chamber to increase heat conductivity between the heater and the electrode.

4. The method as claimed in claim 3, wherein the pressure of gas supplied into the processing chamber is no less than 1 Torr.

5. The method as claimed in claim 3, wherein the gas supplied into the processing chamber is a cleaning gas activated by a remote plasma discharge apparatus.

6. The method as claimed in claim 1, wherein the heating step is conducted by generating plasma by supplying a reaction gas into the processing chamber.

7. The method as claimed in claim 6, wherein the plasma-generating step further comprises forming a dummy film on the lower electrode at lower radiofrequency power than when film forming is conducted on a substrate.

8. The method as claimed in claim 7, wherein the plasma-generating step further comprises dummy-cleaning the dummy film formed on the electrode, wherein heat is generated when a reaction occurs between the dummy film and a cleaning gas for dummy-cleaning.

9. The method as claimed in claim 8, wherein the dummy-cleaning process is conducted by supplying into the processing chamber a cleaning gas activated by a remote plasma discharge apparatus.

10. The method as claimed in claim 7, further comprising supplying gas into the processing chamber after the dummy-cleaning process.

11. The method as claimed in claim 1, wherein the heating step is completed before completion of the loading of a substrate on the electrode.

* * * * *